United States Patent
Zhou et al.

(10) Patent No.: US 11,328,773 B2
(45) Date of Patent: May 10, 2022

(54) QUANTUM STORAGE DEVICE

(71) Applicant: University of Science and Technology of China, Anhui (CN)

(72) Inventors: Zongquan Zhou, Anhui (CN); Chuanfeng Li, Anhui (CN)

(73) Assignee: University of Science and Technology of China, Anhui (CN)

( * ) Notice: Subject to any disclaimer, the term of this patent is extended or adjusted under 35 U.S.C. 154(b) by 0 days.

(21) Appl. No.: 17/281,931

(22) PCT Filed: Oct. 9, 2019

(86) PCT No.: PCT/CN2019/110139
§ 371 (c)(1),
(2) Date: Mar. 31, 2021

(87) PCT Pub. No.: WO2021/068129
PCT Pub. Date: Apr. 15, 2021

(65) Prior Publication Data
US 2021/0391008 A1 Dec. 16, 2021

(51) Int. Cl.
*G11C 13/04* (2006.01)
*H01S 3/00* (2006.01)
(52) U.S. Cl.
CPC .......... *G11C 13/047* (2013.01); *H01S 3/0085* (2013.01)
(58) Field of Classification Search
CPC ...... G11C 13/047; H01S 3/0085; G06N 10/00
See application file for complete search history.

(56) References Cited

U.S. PATENT DOCUMENTS

2003/0031041 A1  2/2003 Hannah et al.

FOREIGN PATENT DOCUMENTS

| CN | 104778969 A | * | 7/2015 | |
| CN | 108270552 | | 7/2018 | |
| CN | 109313922 | | 2/2019 | |
| CN | 110288092 | | 9/2019 | |
| CN | 110288092 B | * | 2/2021 | ............. G06N 10/00 |
| WO | WO 2018/027161 | | 2/2018 | |

OTHER PUBLICATIONS

Mohsen Falamarzi Askarani, "Storage and Reemission of Heralded Telecommunication-Wavelength Photons Using a Crystal Waveguide", Phys. Rev. Applied 11, 054056—Published May 21, 2019 (Year: 2019).*

(Continued)

*Primary Examiner* — Ajay Ojha
(74) *Attorney, Agent, or Firm* — Fish & Richardson P.C.

(57) ABSTRACT

A quantum storage device, including: a sample cryostat configured to load a storage crystal and a filter crystal and configured to cool the storage crystal and the filter crystal to a preset temperature; a laser control system configured to generate a control light and a signal light to perform a quantum storage of the signal light based on a spin population locking; a quantum state encoding and analysis system configured to perform a quantum state encoding and analysis of signal photons; and a filtering system configured to suppress noise introduced by the control light and extract the signal photons.

11 Claims, 4 Drawing Sheets

(56) References Cited

OTHER PUBLICATIONS

Daniel Rieländer, "Quantum Storage of Heralded Single Photons in a Praseodymium Doped Crystal", https://arxiv.org/abs/1310.8261v2 (Year: 2013).*
Heinze et al., "Stopped light and image storage by electromagnetically induced transparency up to the regime of one minute", Phys. Rev. Lett., Jul. 2013, 111(3):033601, 5 pages.
International Search Report and Written Opinion in International Application No. PCT/CN2019/110139, dated Jun. 29, 2020, 13 pages (with machine translation).

* cited by examiner

QUANTUM STORAGE DEVICE

CROSS-REFERENCE TO RELATED APPLICATION

This application is a U.S. National Phase application under 35 U.S.C. § 371 of International Application No. PCT/CN2019/110139, filed on Oct. 9, 2019, entitled "QUANTUM STORAGE DEVICE", the contents of which are incorporated herein by reference in their entirety.

TECHNICAL FIELD

The present disclosure relates to a field of quantum information technology, and in particular to a quantum storage device.

BACKGROUND

An ultimate goal of quantum communication is to build a national and even intercontinental large-scale quantum communication network. At present, the main challenge of quantum communication is to realize long-distance quantum communication. Photons are natural carriers of quantum information. However, since transmission loss of photons in fibers increases exponentially with transmission distance, the current transmission distance is limited to less than 500 km even with the use of telecom low-loss fibers. According to the Non-Cloning Theorem of quantum state, the method of amplifying signals directly with amplifier in classical communication is not applicable to quantum communication.

A feasible long-distance quantum communication scheme is quantum hard disk scheme, in which photons are first stored in an ultra-long-lifetime transportable quantum memory (or called a quantum hard disk), and then the quantum hard disk is transported by classical transport means to realize a long-distance transmission of photons. Considering a transmission distance of thousands of kilometers and a transportation speed of 300 km/h, the quantum hard disk needs to support at least hours of storage lifetime and support photon storage with a high signal-to-noise ratio.

At present, the longest storage time of single photon in photonic memory is on an order of hundreds of milliseconds, and the longest storage time of classic bright light is on an order of minutes [Reference: G. Heinze, C. Hubrich and T. Halfmann, Phys. Rev. Lett. 111, 033601 (2013).]. Such storage times are far from the storage time required by the quantum hard disk, and the physical implementation of the quantum hard disk has great technical challenges.

SUMMARY

The present disclosure provides a quantum storage device, including: a sample cryostat configured to load a storage crystal and a filter crystal and configured to cool the storage crystal and the filter crystal to a preset temperature; a laser control system configured to generate a control light and a signal light to perform a quantum storage of the signal light based on a spin population locking; a quantum state encoding and analysis system configured to perform a quantum state encoding and analysis of signal photons; and a filtering system configured to suppress noise introduced by the control light and extract the signal photons.

In some embodiments, the sample cryostat includes: a low temperature cryostat configured to cool the storage crystal to the preset temperature; and a vibration synchronization device configured to synchronously monitor a vibration signal of the low temperature cryostat.

In some embodiments, the laser control system includes: a frequency stabilized laser configured to generate a series of laser beams; a first acousto-optic modulator configured to modulate one of the laser beams into a control light of the storage crystal; a second acousto-optic modulator configured to modulate one of the laser beams into a single-photon level signal light; a third acousto-optic modulator configured to modulate one of the laser beams into a control light of the filter crystal; and a fourth acousto-optic modulator and a spiral phase plate configured to modulate one of laser beams into a Laguerre-Gaussian mode control light for the storage crystal.

In some embodiments, the quantum state encoding and analysis system includes: a quantum state encoding device configured to load a specific quantum state onto the signal light; and a quantum state analysis device configured to analyze the quantum state of the signal light.

In some embodiments, the filtering system includes: a single-mode fiber configured to filter out noise in space; a narrowband filter configured to filter out spectrum noise on an order of 1 nm accuracy; a high-speed optical switch configured to filter out noise in time; and a filter crystal configured to filter out spectrum noise on an order of 1 MHz accuracy.

In some embodiments, the storage crystal is an YSO crystal doped with $^{151}Eu^{3+}$ or $^{153}Eu^{3+}$.

In some embodiments, in the laser control system, the performing a quantum storage of the signal light based on a spin population locking comprises: selecting an ion ensemble with a target energy level structure from the storage crystal doped with $Eu^{3+}$ ions, and preparing an absorption line of ions of the ion ensemble as an isolated absorption peak in a transparent background; preparing a spatial absorption structure based on a Laguerre-Gaussian mode light field to prepare an absorption structure with an absorption center and a transparent periphery in space on the ion ensemble; performing a short-term storage of incident signal photons on a transition from ground state g energy level to excited state e energy level based on a photon echo storage process of two π/2 pulses; storing the signal photons as a population structure on a transition of ground state g energy level and ground state s energy level based on a spin population locking process of two π pulses to extend a storage life to an order of a spin population life; and reading a photon echo signal in an original direction of the incident signal to reduce noise of the storage process.

In some embodiments, the selecting of an ion ensemble with a target energy level structure from the storage crystal doped with $Eu^{3+}$ ions comprises: applying at least three scanning laser beams that resonate with optical transitions of a sample, and selecting an ion ensemble with same energy level structure from a inhomogeneously broadened absorption profile of the storage crystal doped with $Eu^{3+}$ ions; and removing one of the at least three scanning laser beams to polarize a spin state of the ion ensemble to the same initial state (named as aux energy level); and applying a narrowband scanning laser that resonates with a transition from aux energy level to excited state, and simultaneously applying a scanning laser that resonates with a transition from s energy level to excited state to form an isolated absorption line in a transparent background, and all the ions inside the absorption band stays in the g energy level.

In some embodiments, the preparing of a spatial absorption structure based on a Laguerre-Gaussian mode light field comprises: applying the Laguerre-Gaussian mode light field to the storage crystal, wherein a center of the Laguerre-Gaussian mode light field is a black hole on an order of 100 μm with energy concentrated on an outer periphery; an scanning laser beam with a scanning bandwidth on an order of 10 MHz resonates with a transition from the ground state g energy level to the excited state e energy level to eliminate an absorption of g-e transition; and another scanning laser beam with a scanning bandwidth on an order of 10 MHz resonates with a transition from the ground state s energy level to the excited state e energy level to eliminate an absorption of s-e transition.

In some embodiments, the photon echo storage process of two π/2 pulses comprises: a signal photon pulse resonating with g-e transition; a first π/2 pulse resonating with g-e transition; and a second π/2 pulse resonating with g-e transition; wherein the spin population locking process of two π pulses and the reading process comprise: a first π pulse resonating with s-e transition; a second π pulse resonating with s-e transition; and a first π pulse resonating with g-e transition.

In some embodiments, a polarization state of the generated signal light and a polarization state of the generated control light are orthogonal to each other, and are aligned with polarization maintaining axis of the storage crystal.

BRIEF DESCRIPTION OF THE DRAWINGS

In order to make the above-mentioned features and advantages of the present disclosure more comprehensible, the following specific embodiments are described in detail in conjunction with the drawings.

DETAILED DESCRIPTION

In order to make the purposes, technical solutions and advantages of the present disclosure clearer, the present disclosure will be further described in detail below in connection with specific embodiments and with reference to the drawings.

Figure 1:
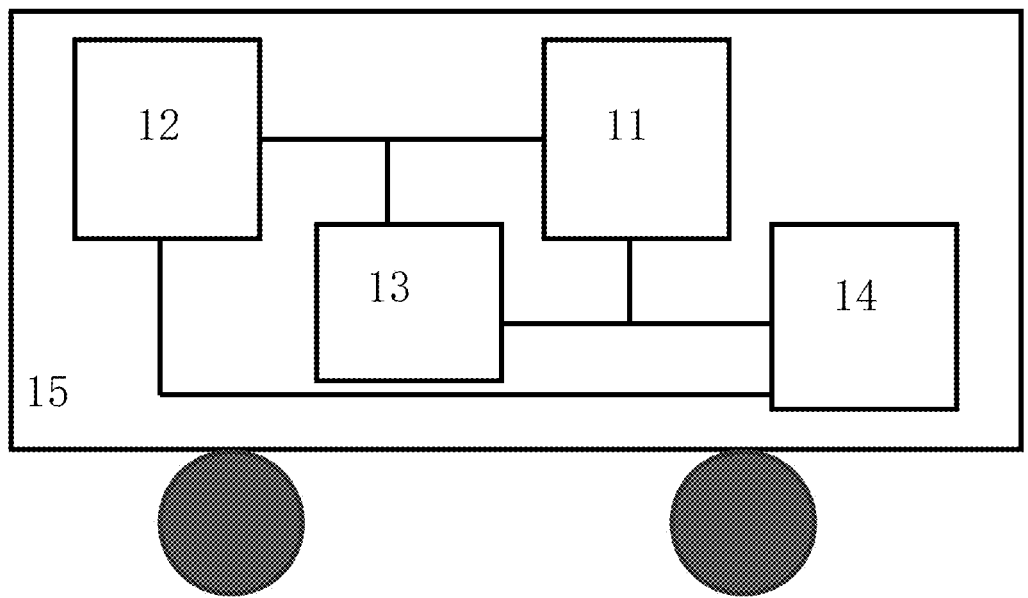
FIG. 1 schematically shows a structural diagram of a transportable quantum storage device according to an embodiment of the present disclosure.

As shown in FIG. 1, an embodiment of the present disclosure provides a transportable quantum storage device, including: a sample cryostat 1 for loading a storage crystal 111 and providing a low-temperature environment with a preset temperature; a laser control system 12 for generating a control light and a signal light, so as to realize a long-life storage scheme based on spin population locking; a quantum state encoding and analysis system 13 for performing a quantum state encoding and analysis of signal photons; a filtering system 14 for suppressing noise introduced by the control light and extracting the signal photons; and a vibration isolation platform 15 for isolating an environmental vibration. The preset temperature here is to cool an electron-phonon interaction in the crystal and extend the coherence time. The temperature range is lower than 4K, for example, 3.5K.

Figure 2:
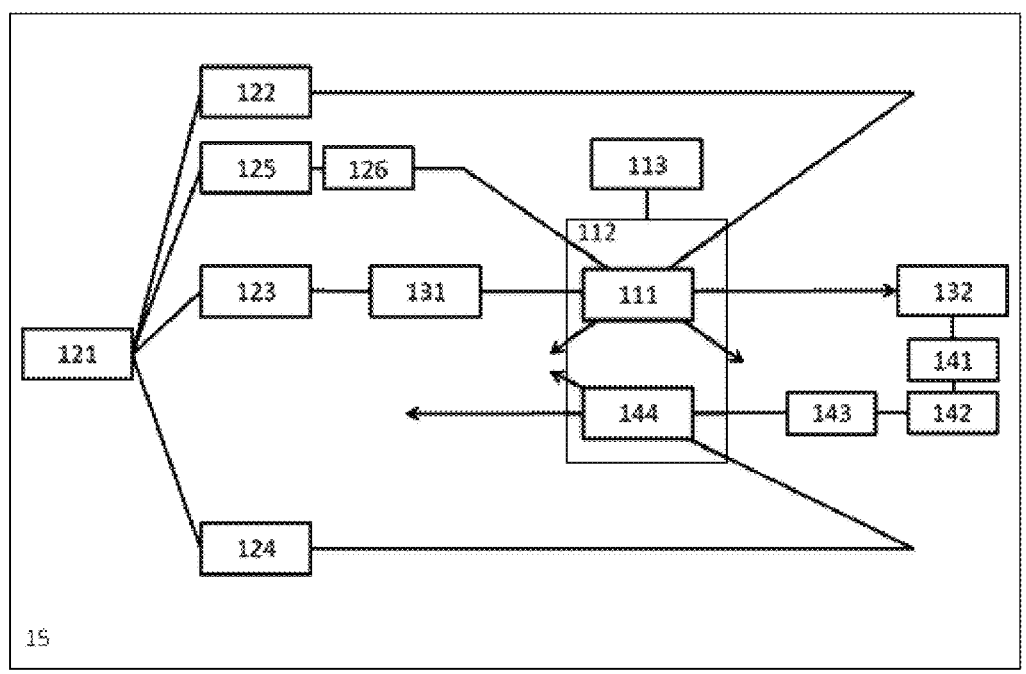
FIG. 2 schematically shows an operating diagram of a transportable quantum storage device according to an embodiment of the present disclosure.

The device will be described below in detail with the embodiments, as shown in FIG. 2. The sample cryostat 11 is used to load the storage crystal 111 to be tested and the filter crystal 144. The low-temperature cryostat 112 is used to cool the storage crystal 111 to the preset temperature, where the operating temperature is set to 3K, and a liquid-helium-free compressor is used for cooling. The storage crystal adopts an YSO crystal doped with $^{151}Eu^{3+}$ with a concentration of 0.1%, with a thickness of 10 mm. A vibration synchronization device 113 is used to synchronously monitor a vibration signal of the low-temperature cryostat 112. The laser control system 12 is used to generate the control light and the signal light.

In some embodiments, a frequency stabilized laser 121 may be selected as a PDH stabilized 580 nm laser with a power of 1 W and a line width of 0.2 kHz. A first acousto-optic modulator 122 may be selected as an acousto-optic modulator with a center frequency of 200 MHz, and may be used to modulate a laser into the control light of the storage crystal. The control light is used to realize a control sequence of the long-life quantum storage method based on the spin population locking, including: selecting an energy level type of ions and initializing a state of the ion ensemble, and then generating two π/2 pulses, two spin shift π pulses and a π pulse for reading the photon echo signal according to the sequence requirements.

A second acousto-optic modulator 123 may be selected as an acousto-optic modulator with a center frequency of 200 MHz, and may be used to modulate a laser into a single-photon level signal light. Typically, a single-photon level pulse with a pulse width of 1 μs is selected.

A third acousto-optic modulator 124 may be selected as an acousto-optic modulator with a center frequency of 200 MHz, and may be used to modulate the laser into the control light of the filter crystal. Typically, a frequency of a scanning laser within 1 MHz around the target frequency is selected.

A fourth acousto-optic modulator 125 may be selected as an acousto-optic modulator with a center frequency of 200 MHz, and a spiral phase plate 126 is selected as a 580 nm first-order spiral phase plate, for modulating the laser into the first-order Laguerre-Gaussian mode control light of the storage crystal.

The quantum state encoding and analysis system 13 is used to perform a quantum state encoding and analysis of signal photons. The quantum state encoding and analysis system 13 may include: a quantum state encoding device 131 for loading a specific quantum state onto the signal photons; and a quantum state analysis device for analyzing the quantum state of the signal photons. In some embodiments, a degree of freedom of an orbital angular momentum of the light is selected to load the quantum state. The quantum state encoding device 131 and the quantum state analysis device 132 are two different spatial light modulators with a resolution of 512×512 and a pixel size of 8 μm, respectively.

The filtering system 14 is used to suppress a noise introduced by the control light and extract signal photons. The filtering system 14 may include a single-mode fiber 141, a narrow-band filter 142, a high-speed optical switch 143, and a filter crystal. The single-mode fiber 141 is used to filter out noise in space, and a 460 nm single-mode polarization maintaining fiber is selected. The narrowband filter 142 is used to filter out spectrum noise at an accuracy of 1 nm, and an interference filter with a bandwidth of 1 nm and a transmittance greater than 99% is selected. The high-speed optical switch 143 is used to filter out noise in time, and a high-speed electro-optic modulation crystal with a switching speed of 3 ns and an extinction ratio of 10000:1 is selected. The filter crystal 144 is used to filter out spectrum noise at an accuracy of 1 MHz, and the filter crystal is selected as an YSO crystal doped with $^{151}Eu^{3+}$ with a concentration of 0.1%, with a thickness of 15 mm.

In some embodiments, the polarization state of the signal light is aligned with D1 axis of the YSO crystal to enhance sample absorption. The polarization state of all control light is aligned with the D2 axis of the YSO crystal. The polarization state of the signal light and the polarization state of the control light are orthogonal to each other to suppress noise caused by the control light.

In some embodiments, the device may further include a vibration isolation platform 15 for isolating the environmental vibration. For example, an active feedback platform implemented by a piezoelectric ceramic is selected.

In an embodiment of the present disclosure, the storage process is strictly synchronized with the vibration signal of the low-temperature cryostat detected by the vibration synchronization device 113, and the low vibration time window is selected to perform the photon storage operation.

In an embodiment of the present disclosure, the storage scheme adopted is a long-life storage method based on spin population locking, and the control light should simultaneously achieve absorption band preparation targets of the storage crystal 111 and the filter crystal 114.

Figure 3:
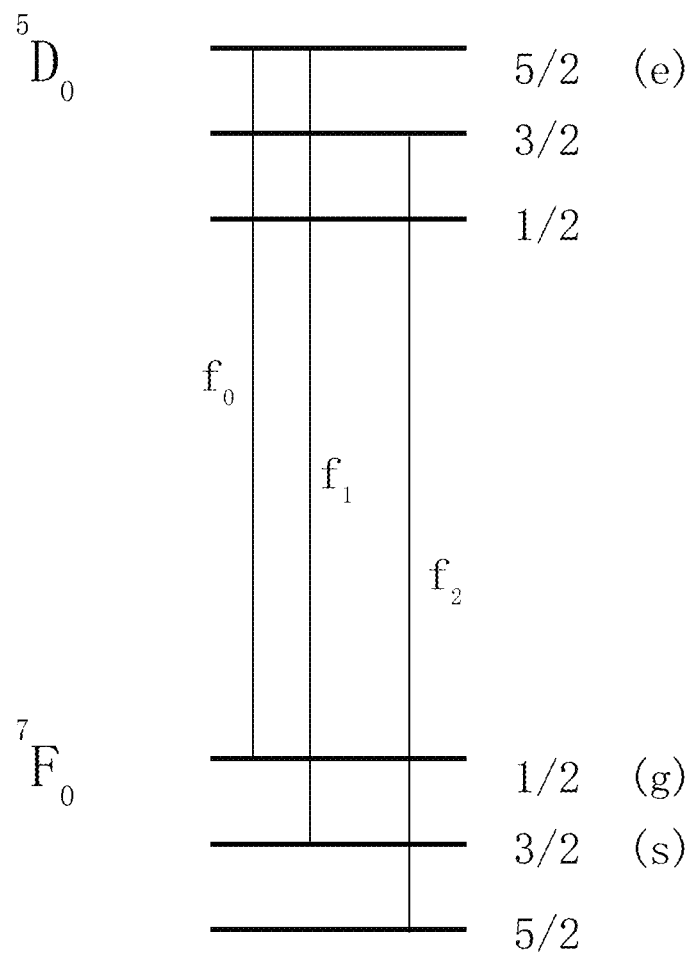
FIG. 3 schematically shows a schematic diagram of an energy level structure and preparation method of a storage crystal according to an embodiment of the present disclosure.

Referring to an energy level structure shown in FIG. 3, operations of the control light may include the following four steps.

1. Energy level selection and initial state preparation of the storage crystal: the preparation target of the storage crystal is to prepare a narrow band absorption line with a line width of 1 MHz in a transparent band with a line width of 6 MHz, where all ions in the absorption line are located at g energy level. A preparation method is as follows.

According to the energy level structure of the storage crystal shown in FIG. 3, a representative implementation method is as follows.

First step: applying scanning lasers with three frequencies of $f_0$, $f_1$, and $f_2$ simultaneously, where $f_0$ beam resonates with g-e transition, $f_1$ beam resonates with s-e transition, and $f_2$ beam resonates with a transition from aux energy level (abbreviation of auxiliary energy level, that is the 5/2 nuclear spin state at the $^7F_0$ energy level) to 3/2 nuclear spin energy state of $^5D_0$ upper energy level. The light field of each frequency scans within +/−3 MHz around the center frequency. The first step realizes a selection of the ion ensemble with the same energy level structure. Here, $f_0$, $f_1$ and $f_2$ are set to 400 MHz, 434.54 MHz and 379.08 MHz respectively, which correspond to a fine energy level structure of the $^{151}Eu^{3+}$ ions in the YSO crystal.

Second step: removing the $f_2$ scanning laser and performing the $f_1$ and $f_0$ scanning lasers constantly, so as to polarize the spin state of the ion ensemble 113 to the same initial state, that is, the aux energy level;

Third Step: removing all the above-mentioned scanning lasers, applying a beam of weak pump light field that scans within +/−0.5 MHz around $f_2$ frequency, and simultaneously applying a beam of weak pump light field that scans within +/−0.5 MHz around $f_1$ frequency, and preparing the population to be in the same initial state, that is, 1/2 nuclear spin energy state of $^7F_0$ lower energy level, within a 2 MHz bandwidth range.

After the above three steps of operations, observing the absorption spectrum of the storage crystal around the $f_0$ frequency, which may present an isolated absorption line with a 1 MHz line width in a 6 MHz transparent band. It meets the requirements of the present disclosure for initial state preparation and reduces the noise of the storage device.

This is performed by using the first acousto-optic modulator 122, with an optical path passing through the modulator twice.

2. Spatial absorption structure preparation of the storage crystal: the preparation target of the space absorption structure of the storage crystal is to prepare a transparent region with a diameter of 1 mm on a light transmission cross section of the storage crystal, where a center 100 μm diameter forms effective absorption. A preparation method is as follows.

After the above energy level selection and initial state preparation of the storage crystal are completed, applying a Laguerre-Gaussian mode light field, where a center of the light field is a black hole of about 100 μm, the energy is concentrated on an outer periphery, and a total spot size is about 1 mm.

Apart of the laser scans around the $f_0$ frequency with a scanning bandwidth of 6 MHz to eliminate the absorption of g-e transition.

The other part of laser scans around the $f_1$ frequency simultaneously, with a scanning bandwidth of 6 MHz, to eliminate the absorption of s-e transition.

After the above operations, observing on the light transmission cross section of the storage crystal. For signal light and control light manipulation pulses, the crystal presents a circular transparent area with a 1 mm diameter, with a circular absorption band with a 100 μm diameter being isolated in the center, which effectively suppresses the optical noise caused by the spatial imperfection of the manipulation pulse.

This is performed by using the fourth acousto-optic modulator 125, with the optical path passing through the modulator twice. In order to load the Laguerre-Gaussian mode, the light field is phase-modulated by a first-order Laguerre-Gaussian mode spiral phase plate 126 to form a ring beam with a central black hole.

3. Absorption band preparation of the filter crystal: the absorption band preparation target of the filter crystal is to prepare a transmission band with a line width of 1 MHz, where the background is a strong absorption band above 2 GHz. This is performed by using the third acousto-optic modulator 124, with the optical path passing through the modulator twice.

4. Storage control process of the storage crystal: according to the control sequence requirements of the long-life storage method based on the spin population locking, firstly using the second acousto-optic modulator 123 to modulate a signal light pulse with a pulse width of about 1 μs, where the frequency of the light field is $f_0$. After waiting for 1 μs, using the first acousto-optic modulator 122 to generate a π/2 pulse of $f_0$ frequency. After 1 μs, applying a π pulse of $f_1$ frequency. After a controllable ultra-long storage time, applying a π pulse of $f_1$ frequency. After 9 μs, applying a π/2 pulse of $f_0$ frequency. Finally, applying a π pulse of $f_0$ frequency. Subsequently, emitting the signal light.

Figure 4:
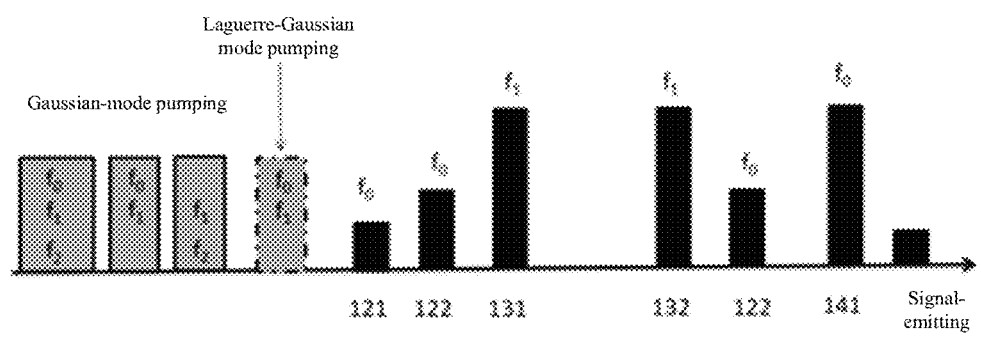
FIG. 4 schematically shows a schematic diagram of a storage control sequence according to an embodiment of the present disclosure.

FIG. 4 shows a schematic diagram of a complete time sequence control of this embodiment, including the above four steps. Where the photon echo storage process of two π/2 pulses comprises: a signal photon pulse (1531) resonating with g-e transition; a first π/2 pulse (1532) resonating with g-e transition; and a second π/2 pulse (1535) resonating with g-e transition; where the spin population locking process of two π pulses and the reading process comprise: a first π pulse (1533) resonating with s-e transition; a second π pulse (1534) resonating with s-e transition; and a first π pulse (1536) resonating with g-e transition.

Figure 5:
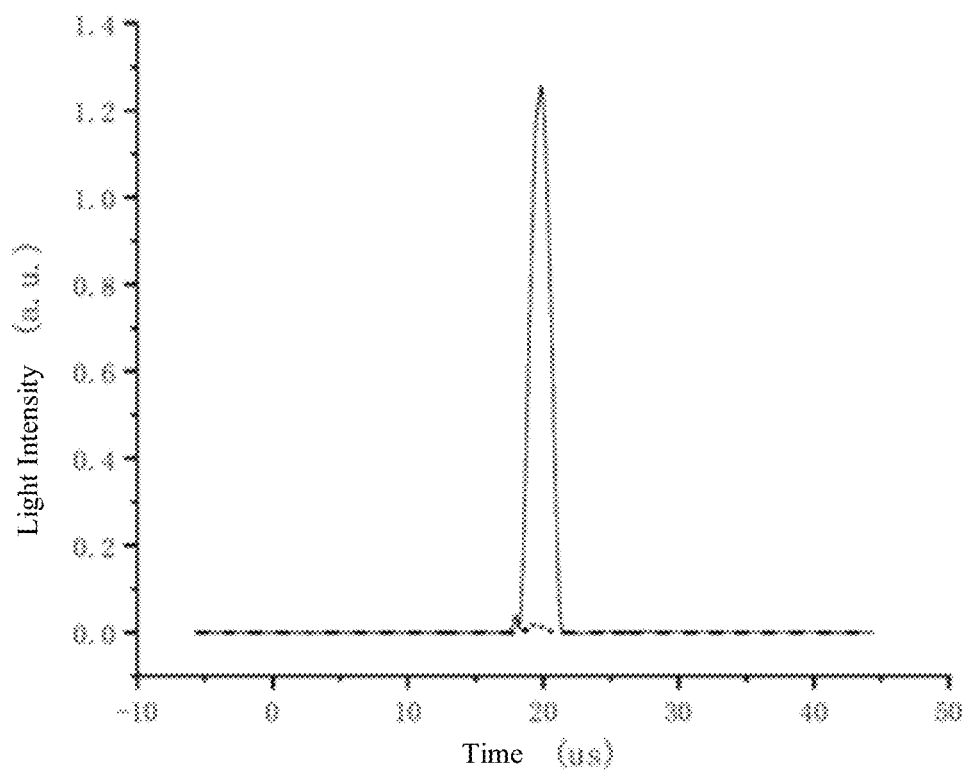
FIG. 5 schematically shows a temporal spectrum of realizing long-lifetime storage of optical superposition state according to an embodiment of the present disclosure.

FIG. 5 shows an output measurement results after storing the quantum superposition state of orbital angular momentum carried by the weak light field. In this embodiment, the number of photons contained in the signal pulse is on an order of $10^7$, which is detected by a photomultiplier tube. The signal pulse carries a quantum superposition state $|LG_{0,-1}\rangle + |LG_{0,+1}\rangle$, where $|LG_{0,-1}\rangle$ and $|LG^{0,+1}\rangle$ correspond to Laguerre-Gaussian mode quantum state carrying $-h/2\pi$ and $+h/2\pi$ respectively. In this embodiment, a storage time is set to 7.2 hours. The solid line in the figure corresponds to the result of measuring the output photons by using $|LG_{0,-1}\rangle + |LG_{0,+1}\rangle$, which shows a significant storage readout signal. The dotted line in the figure corresponds to the result of measuring the output photons by using the orthogonal basis vector $|LG_{0,-1}\rangle - |LG_{0,+1}\rangle$, as shown, which is orthogonal to the output photon state. An interference visibility of the readout quantum state exceeds 99%, which well protects the quantum state carried by the incident pulse. Compared with previously known storage devices, the storage life of the device is greatly improved, and the device should support the storage of photonic quantum state.

By combining the long-life quantum memory with multi-degree-of-freedom filtering technology, the embodiments of the present disclosure realize ultra-long-lifetime photonic quantum state storage, which may be used in many quantum information processing scenarios such as remote quantum communication and remote entanglement distribution. The storage device has the advantages of long storage life, high signal-to-noise ratio, and strong robustness. The device is simple and easy to operate.

The above are only the preferred embodiments of the present disclosure, and are not intended to limit the present disclosure in any form. Those skilled in the art, without departing from the scope of the technical solutions of the present disclosure, may use the methods and technical content disclosed above to make many possible variations and modifications to the technical solutions of the present disclosure, or modify them into equivalent examples. Therefore, any simple modifications, equivalent changes and modifications made to the above embodiments according to the technical essence of the present disclosure without departing from the content of the technical solution of the present disclosure still fall within the protection scope of the technical solutions of the present disclosure.

What is claimed is:

1. A quantum storage device, comprising:
    a sample cryostat configured to load a storage crystal and a filter crystal and configured to cool the storage crystal and the filter crystal to a preset temperature;
    a laser control system configured to generate a control light and a signal light to perform a quantum storage of the signal light based on a spin population locking;
    a quantum state encoding and analysis system configured to perform a quantum state encoding and analysis of signal photons; and
    a filtering system configured to suppress noise introduced by the control light and extract the signal photons.

2. The quantum storage device according to claim 1, wherein the sample cryostat comprises:
    a low temperature cryostat configured to cool the storage crystal to the preset temperature; and
    a vibration synchronization device configured to synchronously monitor a vibration signal of the low temperature cryostat.

3. The quantum storage device according to claim 1, wherein the laser control system comprises:
    a frequency stabilized laser configured to generate a series of laser beams;
    a first acousto-optic modulator configured to modulate one of the laser beams into a control light of the storage crystal;
    a second acousto-optic modulator configured to modulate one of the laser beams into a single-photon level signal light;
    a third acousto-optic modulator configured to modulate one of the laser beams into a control light of the filter crystal; and
    a fourth acousto-optic modulator and a spiral phase plate configured to modulate one of the laser beams into a Laguerre-Gaussian mode control light of the storage crystal.

4. The quantum storage device according to claim 1, wherein the quantum state encoding and analysis system comprises:
    a quantum state encoding device configured to load a specific quantum state onto the signal light; and
    a quantum state analysis device configured to analyze the quantum state of the signal light.

5. The quantum storage device according to claim 1, wherein the filtering system comprises:
    a single-mode fiber configured to filter out noise in space;
    a narrowband filter configured to filter out spectrum noise on an order of 1 nm accuracy;
    a high-speed optical switch configured to filter out noise in time; and
    the filter crystal configured to filter out spectrum noise on an order of 1 MHz accuracy.

6. The quantum storage device according to claim 1, wherein the storage crystal is an YSO crystal doped with $^{151}Eu^{3+}$ or $^{153}Eu^{3+}$.

7. The quantum storage device according to claim 1, wherein in the laser control system, the performing a quantum storage of the signal light based on a spin population locking comprises:
    selecting an ion ensemble with a target energy level structure from the storage crystal doped with $Eu^{3+}$ ions, and preparing an absorption line of ions of the ion ensemble as an isolated absorption peak in a transparent background;
    preparing a spatial absorption structure based on a Laguerre-Gaussian mode light field to prepare an absorption structure with an absorption center and a transparent periphery in space on the ion ensemble;
    performing a short-term storage of incident signal photons on a transition from ground state g energy level to excited state e energy level based on a photon echo storage process of two π/2 pulses;
    storing the signal photons as a population structure on transitions of ground state g energy level and ground state s energy level based on a spin population locking process of two π pulses to extend a storage life to an order of a spin population life; and
    reading a photon echo signal in an original direction of the incident signal to reduce noise of the storage process.

8. The quantum storage device according to claim 7, wherein the selecting an ion ensemble with a target energy level structure from the storage crystal doped with $Eu^{3+}$ ions comprises:

applying at least three scanning laser beams that resonate with an optical transition of a sample, and selecting an ion ensemble with same energy level structure from a inhomogeneously broadened absorption line of the storage crystal doped with $Eu^{3+}$ ions; and removing one of the at least three scanning laser beams to polarize a spin state of the ion ensemble to aux energy level of the same initial state; and applying a narrowband scanning laser that resonates with a transition from aux energy level to excited state, and simultaneously applying a scanning laser that resonates with a transition from s energy level to excited state to form an isolated absorption line in a transparent band, and all ions inside the absorption line are in the g energy level.

9. The quantum storage device according to claim 7, wherein the preparing a space absorption structure based on a Laguerre-Gaussian mode light field comprises:

applying the Laguerre-Gaussian mode light field to the storage crystal, wherein a center of the Laguerre-Gaussian mode light field is a black hole on an order of 100 μm with energy concentrated on an outer periphery;

wherein a scanning laser beam with a scanning bandwidth on an order of 10 MHz resonates with a transition from the ground state g energy level to the excited state e energy level to eliminate an absorption of g-e transition; and another scanning laser beam with a scanning bandwidth on an order of 10 MHz resonates with a transition from the ground state s energy level to the excited state e energy level to eliminate an absorption of s-e transition.

10. The quantum storage device according to claim 7, wherein the photon echo storage process of two π/2 pulses comprises:

a signal photon pulse resonating with g-e transition;
a first π/2 pulse resonating with g-e transition; and
a second π/2 pulse resonating with g-e transition;
wherein the spin population locking process of two π pulses and the reading process comprise:
a first π pulse resonating with s-e transition;
a second π pulse resonating with s-e transition; and
a first π pulse resonating with g-e transition.

11. The quantum storage device according to claim 1, wherein a polarization state of the generated signal light and a polarization state of the generated control light are orthogonal to each other, and are aligned with polarization maintaining axis of the storage crystal.

* * * * *